(12) United States Patent
Behammer

(10) Patent No.: US 6,821,860 B1
(45) Date of Patent: Nov. 23, 2004

(54) INTEGRATED LIMITER AND METHOD FOR PRODUCING AN INTEGRATED LIMITER

(75) Inventor: Dag Behammer, Ulm (DE)

(73) Assignee: United Monolithic Semiconductors GmbH, Ulm (DE)

( * ) Notice: Subject to any disclaimer, the term of this patent is extended or adjusted under 35 U.S.C. 154(b) by 125 days.

(21) Appl. No.: 10/148,118

(22) PCT Filed: Nov. 13, 2000

(86) PCT No.: PCT/DE00/03967

§ 371 (c)(1),
(2), (4) Date: Sep. 20, 2002

(87) PCT Pub. No.: WO01/39270

PCT Pub. Date: May 31, 2001

(30) Foreign Application Priority Data

Nov. 26, 1999 (DE) .......................... 199 56 904

(51) Int. Cl.[7] .............................................. H01L 21/20
(52) U.S. Cl. ...................... 438/381; 257/528
(58) Field of Search ............... 438/622, 631, 438/632, 381; 257/750, 528

(56) References Cited

U.S. PATENT DOCUMENTS 5,268,310 A * 12/1993 Goodrich et al. ........... 438/127
5,341,114 A    8/1994 Calviello et al.
5,343,070 A    8/1994 Goodrich et al.
6,228,673 B1 * 5/2001 Loo et al. ...................... 438/57
6,500,724 B1 * 12/2002 Zurcher et al. ............. 438/384

FOREIGN PATENT DOCUMENTS

DE    197 26 070    12/1998
DE    197 43 240     4/1999

* cited by examiner

Primary Examiner—Douglas Wille
(74) Attorney, Agent, or Firm—Collard & Roe, P.C.

(57) ABSTRACT

The invention relates to a method for production of an integrated limiter.

Figure 1:
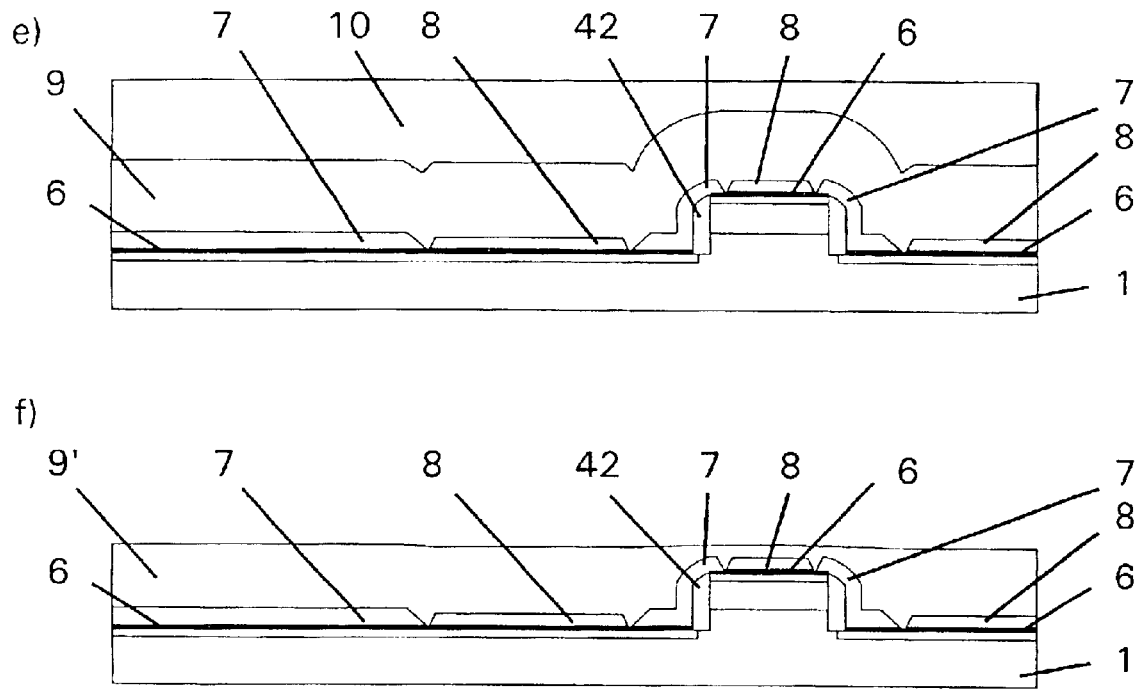

The integrated limiter with PIN diodes has the following structure:

at least one PIN diode is disposed on a highly conductive n+substrate in a first level, at least one resistor is disposed in a second level, at least one capacitor is disposed in a third level, connecting metallization is applied on the third level and the levels are interconnected as an integrated limiter.

8 Claims, 3 Drawing Sheets

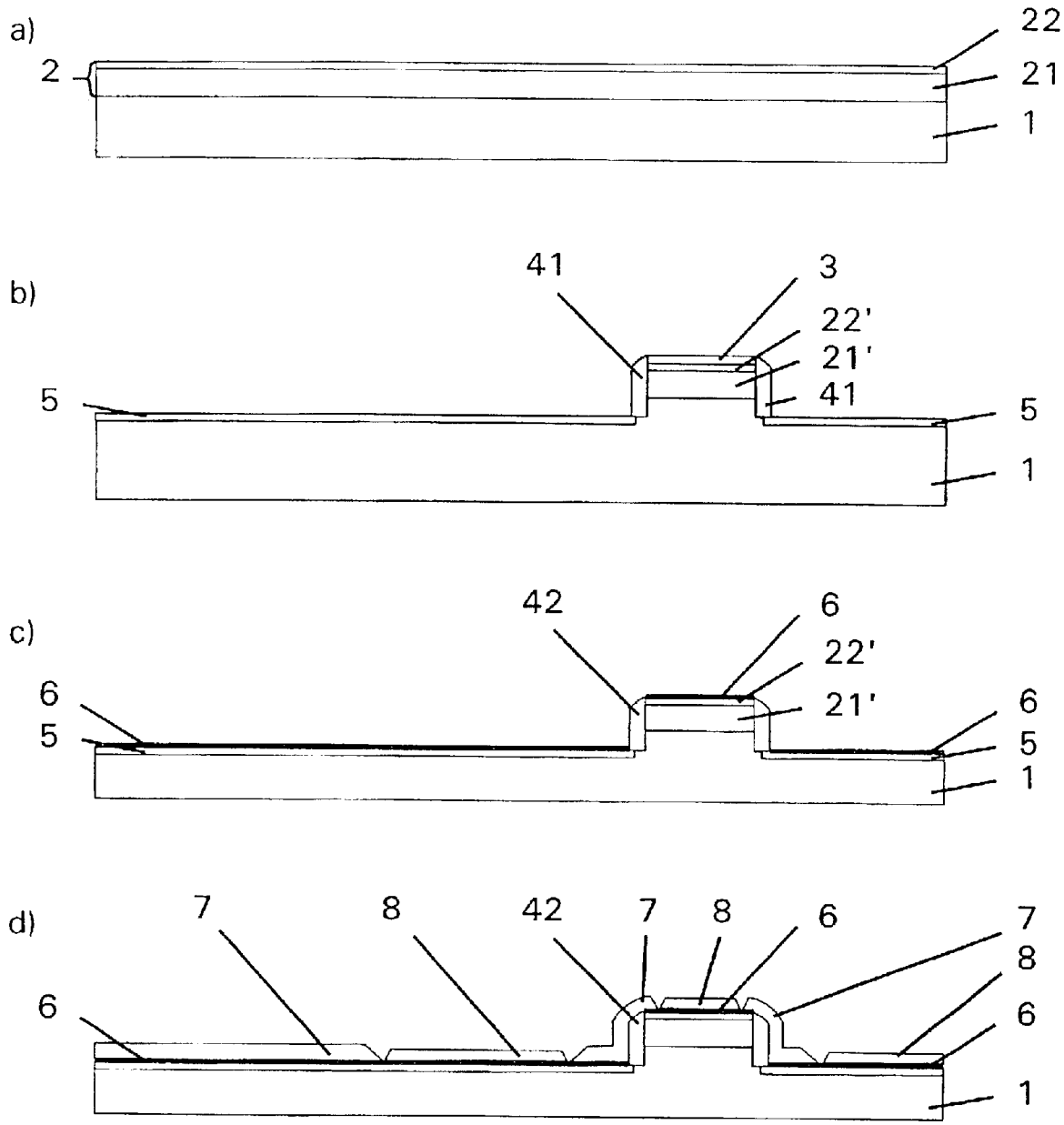

c)

a)

b)

INTEGRATED LIMITER AND METHOD FOR PRODUCING AN INTEGRATED LIMITER

CROSS REFERENCE TO RELATED APPLICATIONS

Applicant claims priority under 35 U.S.C. §119 of German Application No. 199 56 904.5, filed on Nov. 26, 1999. Applicant also claims priority under 35 U.S.C. §120 of PCT/DE00/03967, filed on Nov. 13, 2000. The international application under PCT article 21(2) was not published in English.

DESCRIPTION

The invention relates to a method according to the preamble of claim 1 and to an arrangement according to the preamble of claim 8.

The invention relates to monolithically integrated circuits for microwaves and millimeter waves (MMICs) and in particular to the protection of sensitive receiver amplifiers (LNA) in transmitter-receiver modules (T/R modules) against excessively high HF input power, spikes or electromagnetic pulses.

From the prior art it is known that limiters with high power loss constructed from silicon PIN diodes can be used to protect low-noise receiver amplifiers operating in the frequency range of microwaves and millimeter waves. Heretofore a disadvantage of PIN diodes has been that they cannot be monolithically integrated. This in turn necessitates the production of separate components, which are subsequently incorporated in one circuit and which must be noise-adapted with respect to the different resistances, capacitances, inductances and parasitic values.

A PIN diode of mesa type and a monolithically integrated circuit arrangement with such a PIN diode, a resistor and a capacitor in different levels of a layered structure on a substrate are known, for example, from U.S. Pat. A 5,343,070.

In principle, such amplitude limiters can be used in three different modes of operation:

The conducting mode during reception of weak signals

The limiting mode during reception of high-power signals

The blocking mode, which can be selected remotely by a control signal, to isolate a receiver amplifier from the antenna.

An important consideration for an absorbing amplitude limiter is that, in limiting and blocking mode, the received signal must be absorbed in the limiter and not reflected back to the input of the circuit. Two possibilities are conceivable for designing such an absorbing limiter. The basis for both cases is what is known as a reflecting amplitude limiter, which is composed of quarter-wave lines and preferably two PIN diodes. The two PIN diodes are switched at the input and output sides, in each case against a reference potential.

From German Patent (DE) 19726070 there is known an absorbing amplitude limiter for HF signals with a reflecting limiter, which in particular is composed of a quarter-wave line and a diode that is switched at the input and output sides, in each case against a reference potential. The absorption circuit is provided with a load resistor as well as with a further quarter-wave line connected in series upstream from the limiter. On the input side this has a further diode and the load resistor disposed in series, and it is connected to the reference potential. An HF trap is connected in parallel with the load resistor. In addition, the amplitude limiter can be provided with a controller, which is connected via an additional HF trap to the reflectng limiter, so that the amplitude limiter can be switched between a conducting and a blocking mode.

DE 4136092 A1 teaches a limiter which is integrated into a circuit for microwaves and millimeter waves and which contains antiparallel-connected Schottky diodes, in order to achieve favorable leakage values and good flat leakage values. A diode barrier layer is formed by the barrier layer of a downstream field-effect transistor. The Schottky diodes are located in the transverse branch of a low-pass filter for noise adaptation for the downstream field-effect transistor. All parts are integrated monolithically on one substrate.

The method for production thereof involves a semi-insulating substrate, in which one or more semiconductor layers is or are grown epitaxially thereon and one or more semiconductor layers is or are etched to a mesa. A first set of metal layers is deposited on the substrate, including the mesa, in order to establish Schottky contacts with the underlying semiconductor layers. On the mesa, regions are defined for the Schottky diodes and the first set of metal layers is etched, so that the remaining metallization generates Schottky contacts in these regions. One or more insulating layers is or are deposited on the substrate, including the mesa and the Schottky contacts, and a first set of holes is etched in the insulating layers, in order to expose the semiconductor layers on the mesa. A second set of metal layers is deposited in this first set of holes, in order to establish ohmic contacts with the semiconductor layers. A second set of holes is etched in the insulating layers, in order to expose the Schottky contacts and to deposit a series of metal layers and oxides on the substrate, including the mesa and the first and second sets of holes. The series of layers is etched, in order to generate through an oxide layer present between the metal layers of the series and in order to establish an inductance through a metal layer of the series as well as to generate conductors that connect the ohmic contacts and the Schottky contacts to one another in such a way that the Schottky diodes form an antiparallel group of Schottky diodes integrated monolithically on the substrate. A first and a second Schottky diode are disposed in parallel and with opposite polarity between a first input node and an input node, wherein one of the conductors of the series forms a first end that represents a limiter output for connection of the low-noise amplifier while the; first input node is coupled to the conductor between its first and second end and while the first output node is connected to a reference ground.

A further integrated limiter with an array of antiparallel-connected Schottky diodes is known from U.S. Pat. No. 5,341,114.

The object of the invention is to provide an improved method for production and an arrangement of an integrated limiter.

The invention will be illustrated by the features of claim 1 as regards the method and by the features of claim 8 as regards the arrangement. The further claims contain advantageous embodiments and improvements of the invention.

The invention involves a method for production of an integrated limiter with PIN diodes, wherein a series of layers of a diode structure is deposited on a highly conductive n⁺substrate. By means of a mesa structure that extends into the n⁺substrate, at least one diode is created in this way. The diode is electrically connected by conductor tracks and the surface is covered with a first planarizing layer. On this first planarizing layer there is structured at least one ohmic resistor and there is deposited a first BCB insulating layer, through which diodes and resistor are interconnected by means of conductor tracks. A second planarizing layer is produced with a second BCB insulating layer. On the second planarizing layer there is formed at least one capacitor, which is also interconnected by means of conductor tracks with the diode and resistor via contact holes. A third planarizing layer is structured with a third BCB insulating layer and, via contact holes in the third planarizing layer, the structure is connected by means of conductor tracks and then contacted by connecting metallization. The thicknesses of the BCB layers are selected such that a TFM line (thin-film microstripe) with the least possible loss is formed between the substrate and the topmost metallization layer.

Improved ohmic contact is achieved by highly conductive $n^{++}$contact implantation in the $n^+$substrate, after which an additional first oxide layer is applied on the mesa structure as protection.

For passivation of the lateral flanks of the mesa structure, a sidewall spacer of silicon-rich silicon oxide or silicon nitride is formed.

An additional salicide layer is formed on the p-silicon layer of the mesa and of the substrate surface.

The integrated limiter with PIN diodes has the following structure:

at least one PIN diode is disposed on a highly conductive n+substrate in a first level, at least one resistor is disposed in a second level, at least one capacitor is disposed in a third level, connecting metallization is applied on the third level and the levels are interconnected as an integrated limiter.

A special advantage of the invention is the improved integration capability, whereby such limiters can be produced more cost-effectively.

In addition, lower-temperature processes, with which the overall temperature budget is advantageously kept low, are preferably employed during production.

Figure 2:
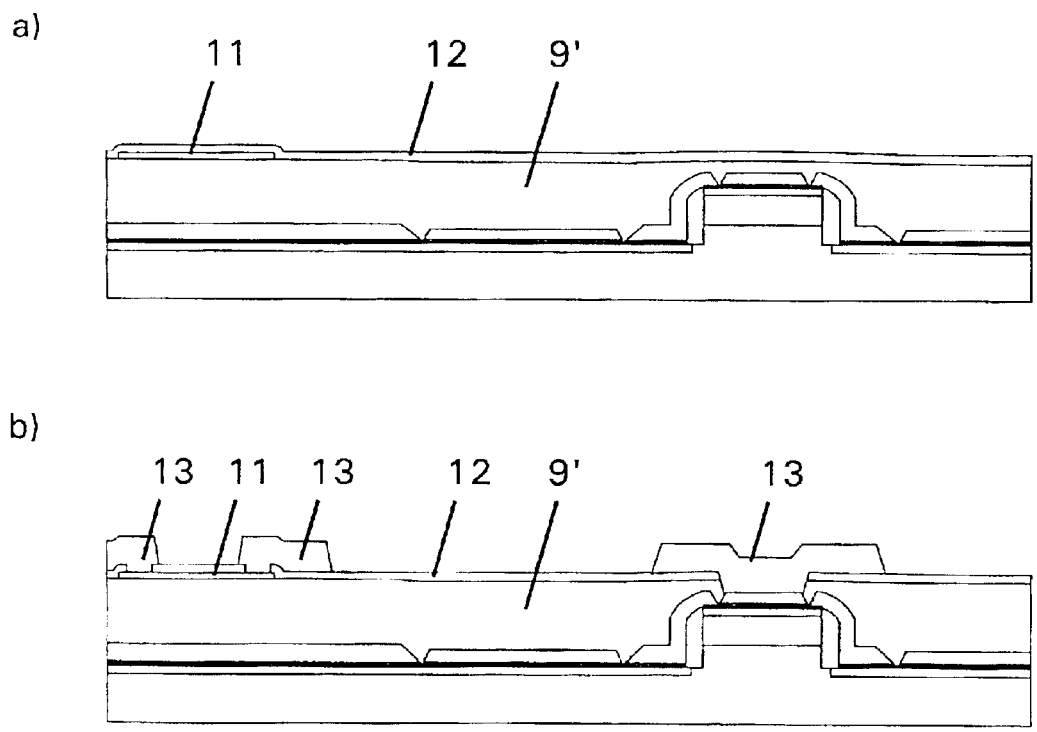
Figure 2:
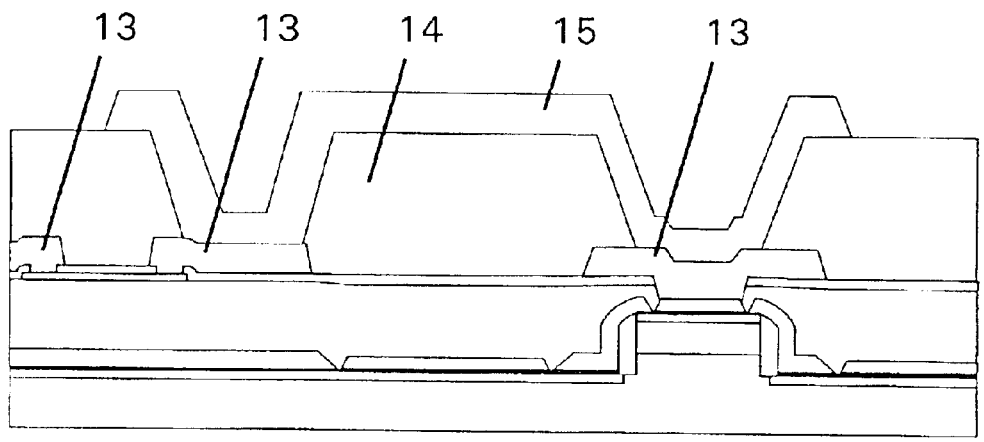
Figure 3:
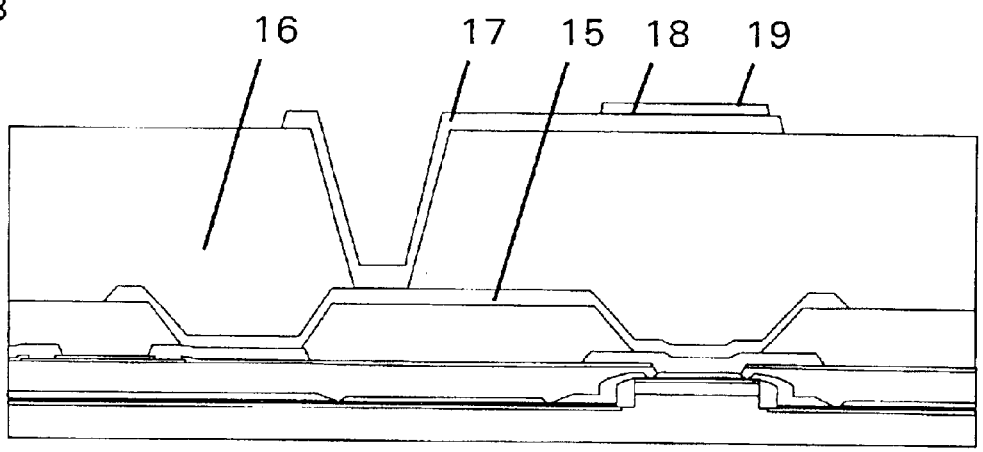
Figure 3:
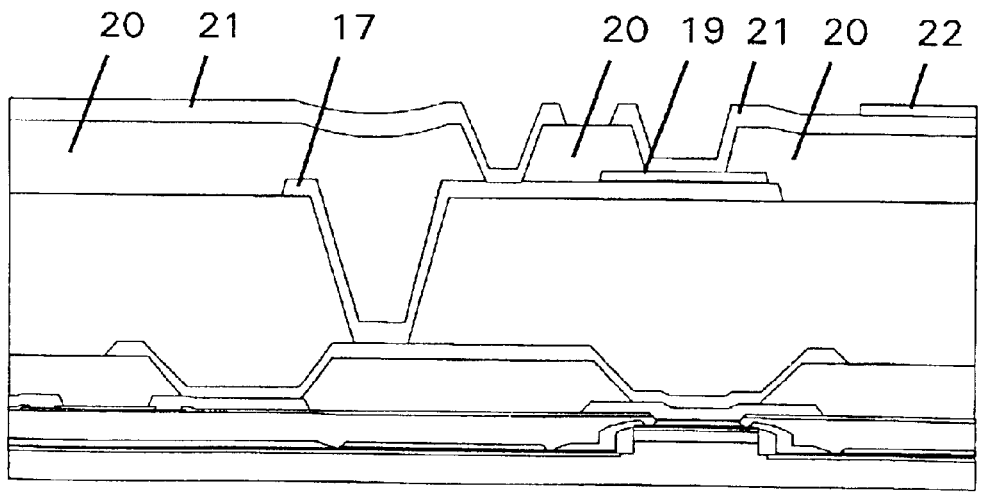

The invention will be explained in more detail hereinafter on the basis of advantageous practical examples with reference to schematic diagrams in the figures, wherein:

FIGS. 1a–f show limiter production methods up to the first planarizing level,

FIGS. 2a–c show limiter production methods up to the second planarizing level,

FIGS. 3a–b show limiter production methods up to the third planarizing level with electrical contact.

In a practical example according to FIG. 1, the method for production of an integrated limiter with PIN diodes up to the first planarizing level is illustrated. A layer sequence of a diode structure 2 in the form of an i-silicon layer 21 and a $p^+$-silicon layer 22 is deposited over the entire surface of a highly conductive $n^+$substrate 1 (FIG. 1a).

The regions for the diodes are covered with an oxide layer 3 having a thickness of about 300 nm. Around these regions layers 21 and 22 are etched down to the $n^+$substrate, thus creating the diode as mesa 21', 22', 3. For protection of the lateral flanks of the mesa structure, sidewall spacers 41 of silicon-rich silicon oxide or silicon nitride are formed in a width of about 200 nm. Improved ohmic contact is, achieved by highly conductive $n^{++}$contact implantation 5 in the $n^+$substrate, while the first oxide layer 3 continues to provide protection on the mesa structure (FIG. 1b).

After oxide layers 3 and 41 have been removed by etching, a brie: f thermal oxidation (RTO) is applied for passivation of the silicon surfaces. Sidewall spacers 42 of silicon-rich silicon oxide or silicon nitride are again formed in a width of 200 nm on the lateral flanks of the mesa structure. After cleaning and dipping in HF, nickel or cobalt is applied over the entire surface and, in the regions where the cobalt is in contact with silicon, it is transformed to silicide (salicide) 6 by heat treatment in an inert-gas atmosphere. The cobalt residues remaining on sidewall spacers 42 are removed by an etching process (FIG. 1c).

The regions for subsequent electrical contacting of the diodes are defined by a second oxide layer 7 having a thickness of about 400 nm. Electrical contact is created by a first metallization 8, by means of lift-off technique in the form, for example, of a sequence of layers of Al/Ti with a thickness of about 300 nm (FIG. 1d). In this step the photoresist structure for definition of the contact holes is simultaneously used as the lift-off mask.

The entire structure is then covered over the entire surface with a third oxide layer 9 having a thickness of about 2 $\mu$m (FIG. 1e).

Thereon there is applied a polyimide layer 10, after which third oxide layer 9 is planarized approximately to the level of the diode mesa. The result is a completely planar residual layer 9' of third oxide layer 9, which covers the diode and the conductor tracks (FIG. 1f).

On this first planarizing layer there is structured at least one ohmic resistor 11, such as $WSi_x$ deposited by a PVD process, and it is covered with a fourth oxide layer 12 functioning as an insulating layer with a thickness of about 200 nm (FIG. 2a).

By opening the insulation, the diode level and the resistor are electrically connected by means of a second metallization 13 of Al/WTi applied by PVD (FIG. 2b).

Above a first BCB insulating layer 14 in a thickness of about 8 $\mu$m, diode and resistor are interconnected by means of conductor tracks 15, which are formed from a third Al/WTi metallization applied in a thickness of about 4 $\mu$m by PVD (FIG. 2c).

A second planarizing layer 16 is produced in the form of a second BCB insulating layer in a thickness of about 34 pm. Electrical connection to the underlying levels is ensured with conductor tracks 17, formed by a fourth Al/WTi metallization. On second planarizing level 16 there is formed at least one capacitor by means of a dielectric 18, and an electrical contact 19 is formed with a fourth metallization, which via contact holes is interconnected by means of the structured conductor tracks with diode and resistor (FIG. 3a).

A third planarizing layer is structured with a third BCB insulating layer 20 in a thickness of about 8 $\mu$m. Via contact holes in the third planarizing layer, the structure is interconnected by means of conductor tracks 21 and is contacted by a connecting metallization 22 formed, for example, from WTi/Au (FIG. 3b).

The integrated limiter contains PIN diodes, resistors and capacitors in a multi-layer metallization. The topmost line on a total of about 50 $\mu$m of BCB as the dielectric forms together with the $n^+$substrate (ground) a microstripe structure. The PIN diodes are applied epitaxially on the substrate, and so are connected to ground. Each level is planarized with BCB insulating layers.

What is claimed is:

1. A method for production of an integrated limiter with PIN diodes, comprising a series of layers of a diode structure (2) is deposited on a highly conductive $n^+$substrate (1), at least one diode is structured by means of a mesa structure, that extends into the $n^+$substrate (1), the diode is electrically connected and the surface is covered with a first planarizing layer (9'), on the first planarizing layer (9') there is structured at least one ohmic resistor, there is deposited a first BCB insulating layer, through which the diodes and the resistor are interconnected by means of conductor tracks, a second planarizing layer (16) is structured with a second BCB insulating layer, on the second planarizing layer there is formed at least one capacitor (17, 18, 19), which is interconnected by means of conductor tracks (17) with the diode and resistor via contact holes, a third planarizing layer (20) is structured with a third BCB insulating layer, via contact holes in the third planarizing layer (20), the structure is interconnected by means of conductor tracks (21) and contacted by connecting metallization (22).

2. A method according to claim 1, wherein a first oxide layer (3) is additionally structured on the mesa structure and a highly conductive $n^{++}$contact implantation is generated in the $n^+$substrate (1).

3. A method according to claim 1, wherein a sidewall passivation (41, 42) of silicon-rich silicon oxide or silicon nitride is formed on the mesa structure.

4. A method according to claim 1, wherein a salicide layer (6) is formed on the p-silicon layer (22') of the mesa and of the substrate surface (1, 5).

5. A method according to claim 1, wherein a diode structure (21', 22') in an opened second oxide layer (7) is electrically connected by means of a first metallization (8).

6. A method according to claim 1, wherein a first planarizing layer (9') is formed by means of a third oxide layer (9) and a polyimide layer (10).

7. A method according to claim 1, wherein an ohmic resistor is formed by means of a resistive layer (11) covered by a fourth oxide layer (12) and by a third metallization (13) for electrical contacting.

8. An integrated limiter, wherein at least one PIN diode in mesa structure is present on a highly conductive $n^+$substrate (1) in a first level, the first level is covered by a first planarizing layer, on which at least one ohmic resistor (11) is disposed in a second level, a first BCB insulating layer (14) is applied on the first planarizing layer, on a second planarizing layer with a second BCB insulating layer (16) there is disposed at least one capacitor (18, 19) in a third level, a third planarizing layer with a third BCB insulating layer (20) is applied on the second planarizing layer, connecting metallization (21) is present over the third BCB insulating layer (20), by means of conductor tracks and contact holes (15, 17) the components of the different levels are interconnected with one another as the limiter.

* * * * *